(12) United States Patent
Morgan

(10) Patent No.: US 6,905,974 B2
(45) Date of Patent: Jun. 14, 2005

(54) METHODS USING A PEROXIDE-GENERATING COMPOUND TO REMOVE GROUP VIII METAL-CONTAINING RESIDUE

(75) Inventor: Paul A. Morgan, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 263 days.

(21) Appl. No.: 10/215,402

(22) Filed: Aug. 8, 2002

(65) Prior Publication Data

US 2004/0029392 A1 Feb. 12, 2004

(51) Int. Cl.$^7$ .............................................. H01L 21/302
(52) U.S. Cl. ........................ 438/745; 438/754; 134/3
(58) Field of Search .................. 438/745, 754; 134/3, 103

(56) References Cited

U.S. PATENT DOCUMENTS

| | | | |
|---|---|---|---|
| 4,078,963 A | | 3/1978 | Symersky |
| 4,902,379 A | | 2/1990 | Rhodes |
| 5,102,499 A | | 4/1992 | Jodgens et al. |
| 5,217,569 A | | 6/1993 | Hodgens, II et al. |
| 5,258,093 A | * | 11/1993 | Maniar ............... 438/3 |
| 5,271,797 A | | 12/1993 | Kamisawa |
| 5,298,280 A | | 3/1994 | Kaczur et al. |
| 5,692,950 A | | 12/1997 | Rutherford et al. |
| 5,695,572 A | * | 12/1997 | Brunner et al. ......... 134/3 |
| 6,006,765 A | | 12/1999 | Skrovan et al. |
| 6,039,633 A | | 3/2000 | Chopra |
| 6,044,851 A | | 4/2000 | Grieger et al. |
| 6,162,301 A | * | 12/2000 | Zhang et al. .............. 134/3 |
| 6,162,738 A | * | 12/2000 | Chen et al. ............. 438/745 |
| 6,245,650 B1 | * | 6/2001 | Watanabe .............. 438/580 |
| 6,431,185 B1 | * | 8/2002 | Tomita et al. .......... 134/1.3 |
| 6,465,403 B1 | * | 10/2002 | Skee .................... 510/175 |
| 2003/0228762 A1 | | 12/2003 | Moeggenborg et al. |

FOREIGN PATENT DOCUMENTS

| | | |
|---|---|---|
| WO | WO 98/04646 | 2/1998 |
| WO | WO 98/06541 | 2/1998 |

OTHER PUBLICATIONS

Duward F. Shriver, Peter Atkins, Cooper H. Langford, "Inorganic Chemistry", second edition, 1994, pp. 187–188.*

Akiya, "Thin–Oxide Dielectric Strength Improvement by Adding a Phosphonic Acid Chelating Agent into $NH_4OH$–$H_2O_2$ Solution," *J. Electrochem. Soc.*, 1994, Oct.; 141(10):L139–L142.

Wolf and Tauber, "*Silicon Processing for the VLSI Era, vol. 1: Process Technology*," Sunset Beach, California, 1986; 519–20.

* cited by examiner

*Primary Examiner*—Kin-Chan Chen
(74) *Attorney, Agent, or Firm*—Mueting, Raasch & Gebhardt, P.A.

(57) ABSTRACT

A method for cleaning substrates to remove Group VIII metal-containing, particularly platinum-containing, residue using a cleaning composition that includes a peroxide-generating compound.

30 Claims, 1 Drawing Sheet

Post-Planarization Wafer Cleaning

Post-Planarization Processing
Equipment Clean

Post-Planarization Wafer Cleaning

METHODS USING A PEROXIDE-GENERATING COMPOUND TO REMOVE GROUP VIII METAL-CONTAINING RESIDUE

FIELD OF THE INVENTION

The present invention pertains to processing and post-processing (e.g., post-etching or post-planarization) compositions and methods using such compositions in the removal of Group VIII metal-containing residue (i.e., contaminants), particularly platinum-containing residue, from substrates and equipment. More particularly, the present invention is directed to the use of hydrogen peroxide, t-butyl peroxide, or other peroxide-generating compounds in cleaning compositions and methods.

BACKGROUND OF THE INVENTION

Films of metals and metal oxides, particularly the heavier elements of Group VIII, are becoming important for a variety of electronic and electrochemical applications. This is at least because many of the Group VIII metal films are generally unreactive toward silicon and metal oxides, resistant to diffusion of oxygen and silicon, and are good conductors. Oxides of certain of these metals also possess these properties, although perhaps to a different extent.

Thus, films of Group VIII metals and metal oxides, particularly the second and third row metals (e.g., Ru, Os, Rh, Ir, Pd, and Pt) have suitable properties for a variety of uses in integrated circuits. For example, they can be used in integrated circuits for electrical contacts. They are particularly suitable for use as barrier layers between the dielectric material and the silicon substrate in memory devices, such as ferroelectric memories. Furthermore, they may even be suitable as the plate (i.e., electrode) itself in capacitors.

Platinum is one of the candidates for use as an electrode for high dielectric capacitors. Capacitors are the basic charge storage devices in random access memory devices, such as dynamic random access memory (DRAM) devices, static random access memory (SRAM) devices, and now ferroelectric memory (FE RAM) devices. They consist of two conductors, such as parallel metal or polysilicon plates, which act as the electrodes (i.e., the storage node electrode and the cell plate capacitor electrode), insulated from each other by a dielectric material (a ferroelectric dielectric material for FE RAMs). Thus, there is a continuing need for methods and materials for the deposition of Group VIII metal-containing films, preferably, platinum-containing films.

Many surfaces that result during the formation of Group VIII metal-containing films, particularly in the wafer fabrication of semiconductor devices, do not have uniform height, and therefore, the wafer thickness is also non-uniform. Further, surfaces may have defects such as crystal lattice damage, scratches, roughness, or embedded particles of dirt or dust. For various fabrication processes to be performed, such as lithography and etching, height non-uniformities and defects at the surface of the wafer must be reduced or eliminated. Various planarization techniques are available to provide such reduction and/or elimination. One such planarization technique includes mechanical and/or chemical-mechanical polishing (abbreviated herein as "CMP").

A large fraction of yield losses in wafer fabrication or processing of semiconductor devices is attributed to contamination. Contaminants can be organic or inorganic particles, films or molecular compounds, ionic materials, or atomic species. Particularly problematic, however, is contamination from material removed from a surface during processing, such as, for example, etching or planarization. For example, during CMP, a rotating substrate of semiconductor material is held against a wetted planarization or polishing surface under controlled chemical liquid (i.e., slurry), pressure, and temperature conditions. The liquid typically consists of an abrasive component, such as alumina, silica, or similar particulates, although, alternatively, a polishing pad could include the abrasive component. Once the planarization or polishing is complete, particulate material that includes the material being removed from the surface being planarized typically remains on the surface of the substrate.

After processing (e.g., etching or CMP), the primary contaminants that need to be removed from the substrate surface include ionic, atomic, or molecular species containing the material being removed (e.g., platinum). Such contaminants may diffuse into the surface of the substrate and down fracture paths.

It has been reported that phosphonic acid chelating agents added to an SC-1 wet cleaning solution (a mixture of $NH_4OH$, $H_2O_2$, and $H_2O$, which typically has a pH of greater than 13) of an RCA clean commonly used to remove particles and organic contaminants on silicon surfaces subsequent to planarization processing, reduces certain metallic contamination deposition on a silicon substrate. This conclusion was reached in the article entitled "Thin-Oxide Dielectric Strength Improvement by Adding a Phosphonic Acid Chelating Agent into $NH_4OH$—$H_2O_2$ Solution" by Akiya et al., *J. Electrochem. Soc.*, Vol. 141, No. 10, October 1994. A mixture of HCl and $H_2O_2$ (SC-2 wet cleaning solution), which typically has a pH of no greater than 2, has been used in an RCA clean to remove metallic contaminants (e.g., alkali ions) subsequent to planarization or etching. Other cleaning solutions include a mixture of sulfuric acid and hydrogen peroxide, (i.e., sulfuric peroxide mixture or "SPM"), preferably at a ratio of 10:1, which typically has a pH of no greater than 1. None of these compositions have been reported to be useful in post-processing of platinum-containing surfaces.

Another problem that has not been adequately addressed is the cleaning of the planarization or polishing surface of equipment both during and after processing. When planarization or polishing surfaces are used with abrasive slurries, it is important to prevent the buildup of contaminants on such polishing surfaces. Such contaminants shorten the effective lifetime of processing equipment and should be removed to ensure precise processing of substrates during planarization or polishing without excessive contamination of the substrates.

Thus, compositions and methods are still needed to reduce, for example, the amount of Group VIII metal-containing contamination of the substrate being processed and the processing equipment used.

SUMMARY OF THE INVENTION

The present invention provides methods for cleaning substrates and/or processing equipment both during and subsequent to processing, such as, for example, planarization (including polishing) processes. Preferably, the methods are used subsequent to processing. The methods involve the use of cleaning compositions that include hydrogen peroxide and/or other peroxide-generating compounds (i.e., compounds capable of generating an $O_2^{-2}$ species) such as t-butyl peroxide, ditertiary butyl peroxide, benzoyl peroxide, ketone peroxides, or other organic peroxides.

The compositions are designed for effective removal of Group VIII metal-containing residue, particularly platinum-containing residue (e.g., particulate contaminants containing platinum or other forms of contamination containing platinum). A "Group VIII metal-containing residue" typically refers to residue having a group VIII metal, preferably platinum, present in an amount of at least about 10 atomic percent, and preferably at least about 50 atomic percent.

Specifically, the present invention provides a method of cleaning a substrate surface and/or processing equipment after processing a substrate surface, preferably in a dry etching process or in a planarization process. This method includes cleaning the substrate surface and/or processing equipment, such as a planarization surface, with the cleaning composition of the present invention. The substrate surface can be a semiconductor-based substrate surface, among many other possibilities.

In one method of cleaning a substrate, the method includes: providing a substrate surface that includes Group VIII metal-containing residue; and contacting the substrate surface with a cleaning composition that includes a peroxide-generating compound to remove at least a portion of the Group VIII metal-containing residue.

In another embodiment, the present invention provides a method of removing planarization residue from a semiconductor-based substrate surface. The method includes: providing a semiconductor-based substrate surface that includes platinum-containing residue formed from a planarization process; and contacting the semiconductor-based substrate surface with a cleaning composition that includes a peroxide-generating compound to remove at least a portion of the platinum-containing residue. Preferably, the method includes: providing a semiconductor-based substrate surface including platinum-containing residue formed from a planarization process; and contacting the semiconductor-based substrate surface with a cleaning composition that includes $H_2O_2$ at a pH of 3 to 13 and a temperature of no greater than about 60° C. to remove at least a portion of the platinum-containing residue.

In one method of cleaning processing equipment, the method includes: providing processing equipment that includes a planarization surface including Group VIII metal-containing residue; and contacting the planarization surface with a cleaning composition that includes a peroxide-generating compound to remove at least a portion of the Group VIII metal-containing residue.

In another embodiment, the present invention provides a method of cleaning processing equipment. The method includes: providing processing equipment that includes a planarization surface including platinum-containing residue; and contacting the planarization surface with a cleaning composition that includes a peroxide-generating compound to remove at least a portion of the platinum-containing residue. Preferably, the method includes: providing processing equipment that includes a planarization surface including platinum-containing residue; and contacting the planarization surface with a cleaning composition including $H_2O_2$ at a pH of 3 to 13 and a temperature of no greater than about 60° C. to remove at least a portion of the platinum-containing residue.

DETAILED DESCRIPTION OF THE INVENTION

Figure 1:
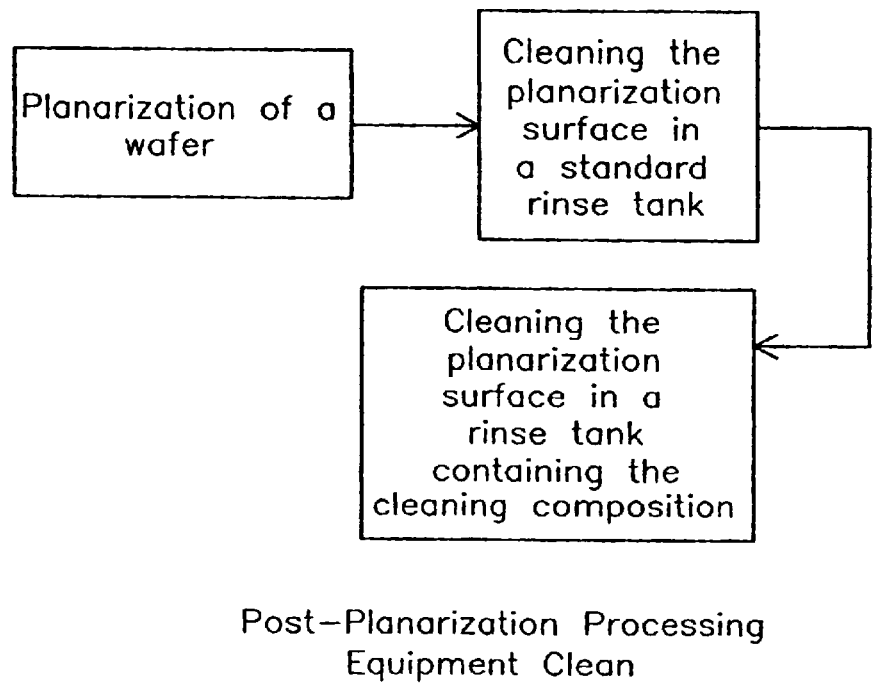
FIG. 1 illustrates a process flow for using a cleaning composition to clean semiconductor-based substrates subsequent to planarization in accordance with the present invention.

The present invention is directed to methods of cleaning substrates and processing equipment, and in particular to cleaning substrates and planarization processing equipment both during and subsequent to processing, such as, for example, planarization of semiconductor-based substrate surfaces (i.e., surfaces of structures formed at least in part with a semiconductor material) using a liquid composition including a quantity of a peroxide-generating compound. Preferably, the cleaning occurs subsequent to processing (e.g., planarizing) of a Group VIII metal—(i.e., platinum-) containing surface. The compositions are designed to effectively remove platinum-containing particulate material and other platinum-containing residue as well as other Group VIII metal-containing particulate material and other residue. Significantly, residue containing platinum alloys such as Pt/Ir and Pt/Rh can be removed.

It is to be understood that the term processing as used herein is meant to encompass a wide variety of planarization techniques, as well known to one skilled in the art, whereby planarization is accomplished through mechanical abrasion of the substrate. Processing can also encompass planarization that uses a chemically active component, such as in, for example, chemical mechanical planarization (CMP). Planarization and polishing processing are described generally herein as planarization, as both terms are meant to encompass abrasion of the substrate, even though polishing typically refers to less abrasion of the substrate than planarization. Such processing can be local or global. Processing can also include wet or dry etching processes, as well as other semiconductor fabrication steps that result in the formation of Group VIII metal-containing contaminants (i.e., residue).

It is also to be understood that the term "substrate" includes a wide variety of semiconductor-based structures and other substrates that can be contaminated by Group VIII metal-containing materials during processing. Substrate can be a single material, such as, for example, a silicon wafer. Substrate is also to be understood as including silicon-on-sapphire (SOS) technology, silicon-on-insulator (SOI) technology, doped and undoped semiconductors, epitaxial layers of silicon supported by a base semiconductor, as well as other semiconductor-based structures, including any number of layers as is well known to one skilled in the art. Furthermore, when reference is made to a substrate in the following description, previous process steps may have been utilized to form regions/junctions in a base semiconductor structure. The following detailed description is, therefore, not to be taken in a limiting sense, and the scope of the present invention is defined by the appended claims.

The liquid composition of the present invention is used to reduce the amount of, for example, Group VIII metal—(particularly platinum-) containing particulate contaminants left on the substrate and planarization processing equipment as a result of processing (e.g., planarization). With the present invention, substrates and processing equipment can be cleaned effectively, removing Group VIII metal-containing (particularly platinum-) containing contaminants. For example, in semiconductor-based device fabrication, the present invention enables higher yields to be realized in the fabrication of semiconductor-based integrated circuits due to the reduction in wafer losses due to excessive residual particulate contamination, which often degrades electrical performance of an integrated circuit. Furthermore, by using cleaning compositions of this invention, processing equipment can be cleaned in situ, minimizing down time in the fabrication of integrated circuits.

The composition of the residue remaining depends on the details of the process. It is often referred to as planarization residue, etch residue, post-planarization residue, polishing residue, film residue, residue, contaminants, debris, detritus, etc. Typically, the residue includes particulate matter that has been dislodged from a surface, but also may include materials that were used in the processing (e.g., planarization) of the surface. This residue that has been removed from a surface may be of the same chemical composition as that of the material of the surface as occurs, for example, as a result of mechanical planarization, or it may be chemically modified as occurs, for example, as a result of chemical-mechanical planarization. Typically, the target contaminants of which the present invention is beneficial in removing, include Group VIII (particularly platinum) ions, atoms, or molecules, particularly oxides, that occur, for example, in planarization residue. For example, the target contaminants can include Pt metal as well as Pt/Ir and Pt/Rh alloys. Other contaminants may also be simultaneously removed, including, for example, ions, atoms, molecules, or compounds of: the alkali metals such as sodium (Na), potassium (K) and lithium (Li); alkaline earth metals such as magnesium (Mg) and calcium (Ca); and heavy metals such as iron (Fe), nickel (Ni), zinc (Zn), manganese (Mn), titanium (Ti), zirconium (Zr), and copper (Cu). The target particulate material of which the present invention is particularly beneficial in removing includes platinum.

Because processing residue, particularly planarization or etching residue, has been frequently referred to in the prior art, it is believed that one of ordinary skill in the art readily recognizes residue as that term is used herein. In general, the precise composition of the residue depends on a number of factors, including the details of the process and the composition of the surface being subjected to processing (e.g., planarization or etching). It is generally true, however, that the residue is not chemically bonded to the surface, where "chemically bonded" refers to the chemical bonds that bind together the surface atoms of the substrate (e.g., semiconductor device). The chemical bonds that bind these surface atoms are generally covalent bonds, and thus the planarization residue being contemplated by the invention is not covalently bound to the substrate surface. Instead, the residue sits on top of a substrate, such as a semiconductor device, and may be held in place by friction, ionic bonds, van der Waals forces and other non-covalent bonds. The peroxide-generating compound-containing (preferably $H_2O_2$-containing) cleaning compositions of the present invention can function in a variety of ways. Although not intending to be limiting, it is believed that platinum, for example, acts as a catalytic surface for the relatively violent decomposition, for example of $H_2O_2$ to $H_2$ and $O_2$. It is further believed that this vigorous evolution of $H_2$ and/or $O_2$ gases on the contaminant in particle form physically lifts and moves the particles from the surface allowing for removal. However, the purpose of compositions of the present invention is to remove contaminants from substrate and processing equipment surfaces, whatever mechanism is involved. Therefore, the present invention is not necessarily limited to any particular mechanism.

The compositions include a peroxide-generating compound (preferably hydrogen peroxide), which can be used as an aqueous solution (typically, in deionized water at a concentration of about 30% to about 40% by weight). Alternatively, the peroxide-generating compound (preferably hydrogen peroxide) can be mixed with a suitable solvent or composition to form the cleaning composition. Compositions of the present invention are typically aqueous based, although other solvents, such as, for example, organic solvents, can be used in place of, or in addition to, water. Preferably, distilled and/or deionized water is used. Examples of suitable organic solvents include hydroxyl-containing solvents such as methanol, ethanol, n-propanol, iso-propanol, n-butanol, t-butanol, iso-butanol, sec-butanol, propylene glycol, and ethylene glycol. The organic solvent may be present in an amount ranging from about 0.01% by weight to about 95% by weight if desired. Thus, the cleaning composition may be completely aqueous, or may be essentially organic with water present as only a minor ingredient.

The amount of peroxide-generating compound (preferably, hydrogen peroxide) used in the cleaning compositions of the present invention is an amount effective to reduce the concentration of Group VIII metal-containing contaminants. For example, concentrations of hydrogen peroxide in a cleaning composition can be up to about 36% by weight, which is typically commercially available, or even higher (e.g., up to about 60%) of the compositions in which they are used. Preferably, a peroxide-generating compound is present in the composition in an amount of no greater than about 5% by weight, and more preferably, about 0.1% to about 4% by weight.

The compositions of the present invention can also have other additives such as surfactants added, examples of which are well known to one skilled in the art. The surfactants may be anionic, cationic, or nonionic. Preferably, they are nonionic. Examples of suitable surfactants include TRITON X-100. Such surfactants can be used in an amount of no greater than about 10 parts per million by weight if desired.

Also, the compositions of the present invention can also include other additives that assist in the removal of other contaminants (e.g., abrasive oxide particles) from Group VIII metal-containing surfaces that have been planarized or otherwise processed. These include, for example, $NH_4OH$, $H_2SO_4$, HF, etc. Other additives that enhance removal of contaminants, particularly particulate material, include, without limitation, acetic acid, citric acid and other carboxylic acids, phosphoric acid, ammonia, ammonium citrate, and other common suspending agents or other process chemicals. Such additives should be selected such that they do not adversely damage (e.g., etch) the surface being cleaned. Such additives can be used in an amount of about 1% by weight to about 20% by weight if desired.

The compositions of the present invention preferably do not include strong acids or bases. That is, preferably the compositions have a pH of at least 3 and no greater than 13. Particularly preferred compositions have a pH of 3 to 6. Alkaline compositions, preferably having a pH of 8 to 13, may also be used in the methods of the present invention.

The compositions used in the present invention can be used in a wide variety of manners. As illustrated in FIG. 1, the cleaning compositions of the present invention are useful for removing post-processing, for example, post-planarization, contamination from substrate surfaces. Compositions of the present invention can be used on substrates having junctions, isolation areas, steps, polysilicon lines, dielectrics, oxide-filled trenches, various metal films, doped oxides, spin on glasses, borophosphosilicate glass (BPSG), or any other such surface which may require processing, for example, planarization, and subsequent cleaning to remove Group VIII metal-containing contaminants.

Figure 2:
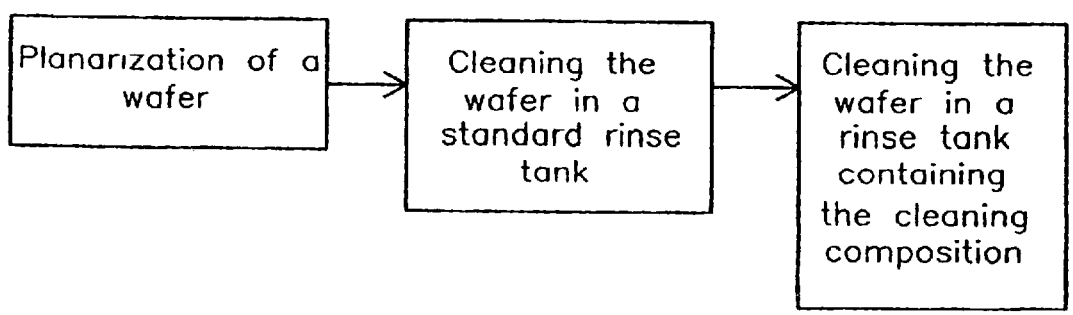
FIG. 2 illustrates a process flow for using the cleaning composition to clean planarization processing equipment in accordance with the present invention.

As illustrated in FIG. 2, the compositions of the present invention can also be used as cleaning compositions to clean planarization equipment after planarization processing. For example, polishing surfaces, abrasive pads, or any other such planarization surface that contacts a slurry or nonabrasive chemical component during planarization can be cleaned with the compositions of the present invention. Furthermore, the present invention is not limited to use with nonplanar surfaces. The present invention is also beneficial for use with substantially planar surfaces. Therefore, the present invention is not limited to the cleaning of any particular surface, but is limited only in accordance with the invention as described in the accompanying claims.

When using cleaning compositions of the invention for cleaning planarization processing equipment, planarization equipment can be cleaned during or after planarization processing. Typically, however, they are used after the planarization process is complete.

The cleaning compositions described herein can be used in a variety of systems for removing Group VIII metal-containing particulates and other forms of Group VIII metal-containing contaminants from substrates. For example, they can be used in ultrasonic or brush-cleaning systems. In a specific example, a semiconductor device having platinum-containing planarization residue may be placed into a bath of the cleaning composition (where the "cleaning composition" includes a liquid composition including a peroxide compound such as hydrogen peroxide and optionally ammonium citrate), whereupon planarization residue will become suspended, dispersed, and/or dissolved in the cleaning composition and the device surface will become relatively free of the residue. Room temperature and low temperatures (down to the freezing point of the cleaning composition) are typically used in cleaning methods. Elevated temperatures (e.g., about 40° C. to about 60° C.) may be employed to hasten residue removal, although elevated temperatures (e.g., above about 60° C.) may cause undesirable decomposition of the cleaning composition.

It is preferred that some mechanical action take place while the cleaning composition contacts the residue-containing device surface, in order to facilitate removal of the residue from the surface. For example, the bath of cleaning composition may be a recirculating bath, in order that a current of cleaning composition regularly passes over the residue-containing surface. Alternatively, or in addition, the bath may include vibration action, such as ultrasonic or megasonic action (depending on the frequency of vibration). As another example, the cleaning composition may be sprayed onto the device surface, where the spray pressure assists in removing residue from the device surface. As a further example, scrubbing action, as provided, for example, by a brush, in combination with the cleaning composition, may be employed. Devices (known as scrubbers, typically pinch roller scrubbers) intended for the removal of planarization residue, which provide scrubbing action through brushes (typically brushes made from PVA), are commercially available and known to one of ordinary skill in the art. Such ultrasonic techniques, high pressure spraying techniques, mechanical scrubbing techniques, etc. are well known to one of skill in the art. Certain of them are described in U.S. Pat. No. 6,006,765 (Skrovan et al.) and in Wolf and Tauber, *Silicon Processing for the VLSI ERA*, Vol. 1: Process Technology, pages 519–520 (1986). The preferred method of contacting the residue-containing surface with the cleaning composition may depend, in part, on the nature of the residue-containing surface and the details of the planarization process that formed the residue.

It is not necessary to pre-form the cleaning composition before contacting the composition with the residue-containing surface. The surface may first be contacted with one or two of the components used to prepare the cleaning composition, and then the remaining components may be added, either alone or separately, either in one shot or metered in. Because various components of the composition may be metered into a batch solution at various times and rates, it is difficult to precisely define the concentration of each of the components that are contacted with the surface. However, the inventive method includes the method wherein the various components of the cleaning composition are sequentially added to an environment that also contains the residue-containing surface.

The following example is offered to further illustrate the various specific and preferred embodiments and techniques. It should be understood, however, that many variations and modifications may be made while remaining within the scope of the present invention.

EXAMPLE

A semiconductor wafer is processed using a polishing tool thereby producing a platinum film on the surface of the wafer. This is immersed in a bath containing a solution of deionized water, ammonium citrate, and hydrogen peroxide in a volume ratio of 10 to 1 to 0.5 and at a temperature of 40° C. Megasonics is applied to suspend the slurry particles and the platinum residue in solution. The wafer is then transferred to a vessel for rinsing and then drying.

The foregoing detailed description and examples have been given for clarity of understanding only. No unnecessary limitations are to be understood therefrom. The invention is not limited to the exact details shown and described, for variations obvious to one skilled in the art will be included within the invention defined by the claims. The complete disclosures of all patents, patent documents, and publications listed herein are incorporated by reference, as if each were individually incorporated by reference.

What is claimed is:

1. A method of cleaning a substrate, the method comprising:
   providing a substrate surface comprising Group VIII metal-containing residue; and
   contacting the substrate surface with a cleaning composition comprising a peroxide-generating compound to remove at least a portion of the Group VIII metal-containing residue, with the proviso that the cleaning composition does not comprise a strong acid.

2. The method according to claim 1, wherein the Group VIII metal-containing residue comprises platinum-containing residue.

3. The method according to claim 2, wherein the platinum-containing residue comprises a platinum alloy.

4. The method according to claim 3, wherein the platinum alloy comprises Pt/Ir or Pt/Rh.

5. The method according to claim 1, wherein the Group VIII metal-containing residue results from planarization of the substrate surface.

6. The method according to claim 1, wherein the Group VIII metal-containing residue results from etching the substrate surface.

7. The method according to claim 1, wherein the peroxide-generating compound is $H_2O_2$ or an organic peroxide.

8. The method according to claim 7, wherein the peroxide-generating compound is present in an amount of at least about 0.1% by weight.

9. The method according to claim 7, wherein the peroxide-generating compound is present in an amount of no greater than about 5% by weight.

10. The method according to claim 9, wherein the peroxide-generating compound is present in the cleaning composition in an amount of no greater than about 4% by weight.

11. The method according to claim 1, wherein providing a substrate surface comprises providing a semiconductor-based substrate surface.

12. The method according to claim 1, wherein contacting the substrate surface with a cleaning composition comprises immersing the substrate surface in the cleaning composition.

13. The method according to claim 1, wherein contacting the substrate surface with a cleaning composition comprises applying mechanical action to the substrate surface when in contact with the cleaning composition.

14. The method according to claim 13, wherein the mechanical action is applied by pinch roller scrubbers.

15. The method according to claim 13, wherein the mechanical action is vibration.

16. The method according to claim 1, wherein the cleaning composition further comprises a surfactant.

17. The method according claim 1, wherein the cleaning composition further comprises deionized water.

18. The method according to claim 1, wherein the cleaning composition is at a temperature of no greater than about 60° C.

19. The method according to claim 1, wherein the cleaning composition has a pH of at least 3.

20. The method according to claim 1, wherein the cleaning composition has a pH of no greater than 13.

21. A method of removing planarization residue from a semiconductor-based substrate surface, the method comprising:

providing a semiconductor-based substrate surface comprising platinum-containing residue formed from a planarization process; and contacting the semiconductor-based substrate surface with a cleaning composition comprising a peroxide-generating compound to remove at least a portion of the platinum-containing residue, with the proviso that the cleaning composition does not comprise a strong acid.

22. The method according to claim 21, wherein the peroxide-generating compound is $H_2O_2$.

23. The method according to claim 21, wherein the platinum-containing residue comprises a platinum alloy.

24. The method according to claim 23, wherein the platinum alloy comprises Pt/Ir or Pt/Rh.

25. The method according to claim 21, wherein the platinum-containing residue results from chemical-mechanical planarization of the semiconductor-based substrate surface.

26. The method according to claim 21, wherein contacting the substrate surface with a cleaning composition comprises immersing the semiconductor-based substrate surface in the cleaning composition.

27. The method according to claim 26, wherein contacting the semiconductor-based substrate surface with a cleaning composition comprises applying mechanical action to the semiconductor-based substrate surface when in contact with the cleaning composition.

28. The method according to claim 21, wherein the cleaning composition further comprises a surfactant.

29. The method according to claim 21, wherein the cleaning composition is at a temperature of no greater than about 60° C.

30. A method of removing planarization residue from a semiconductor-based substrate surface, the method comprising:

providing a semiconductor-based substrate surface comprising platinum-containing residue formed from a planarization process; and contacting the semiconductor-based substrate surface with a cleaning composition comprising $H_2O_2$ at a pH of 3 to 13 and a temperature of no greater than about 60° C. to remove at least a portion of the platinum-containing residue, with the proviso that the cleaning composition does not comprise a strong acid.

* * * * *